(12) United States Patent
Kim et al.

(10) Patent No.: US 9,882,043 B2
(45) Date of Patent: Jan. 30, 2018

(54) SEMICONDUCTOR DEVICE WITH TRENCH TERMINATION STRUCTURE

(71) Applicant: Magnachip Semiconductor, Ltd., Cheongju-si (KR)

(72) Inventors: Young Jae Kim, Incheon-si (KR); Jin Woo Han, Bucheon-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 38 days.

(21) Appl. No.: 14/584,073

(22) Filed: Dec. 29, 2014

(65) Prior Publication Data

US 2015/0263084 A1 Sep. 17, 2015

(30) Foreign Application Priority Data

Mar. 11, 2014 (KR) .................. 10-2014-0028627

(51) Int. Cl.
*H01L 29/78* (2006.01)
*H01L 29/40* (2006.01)
*H01L 29/423* (2006.01)
*H01L 29/10* (2006.01)
*H01L 29/49* (2006.01)
*H01L 29/417* (2006.01)

(52) U.S. Cl.
CPC .......... *H01L 29/78* (2013.01); *H01L 29/1095* (2013.01); *H01L 29/407* (2013.01); *H01L 29/42372* (2013.01); *H01L 29/7811* (2013.01); *H01L 29/7813* (2013.01); *H01L 29/41766* (2013.01); *H01L 29/4916* (2013.01)

(58) Field of Classification Search
CPC ................................................. H01L 29/7811
See application file for complete search history.

(56) References Cited

U.S. PATENT DOCUMENTS

| | | | |
|---|---|---|---|
| 8,558,308 B1* | 10/2013 | Blank | H01L 29/66348 257/335 |
| 2008/0179662 A1* | 7/2008 | Hshieh | H01L 29/407 257/328 |
| 2009/0212435 A1* | 8/2009 | Montgomery | H01L 24/02 257/759 |
| 2009/0315175 A1* | 12/2009 | Okada | H01L 23/4952 257/737 |
| 2013/0175574 A1* | 7/2013 | Matsuura | H01L 29/66348 257/139 |
| 2013/0334565 A1* | 12/2013 | Hutzler | H01L 29/66333 257/139 |
| 2014/0061783 A1* | 3/2014 | Xiao | H01L 29/861 257/333 |

(Continued)

*Primary Examiner* — John P Dulka
(74) *Attorney, Agent, or Firm* — NSIP Law

(57) ABSTRACT

The present disclosure relates to a semiconductor device in which a trench termination structure is applied. There is disclosed a semiconductor device of which structure is partially improved so that a P body area is not formed in an adjacent area of a gate pad. The semiconductor device includes a gate pad formed on a substrate, an active area formed in the substrate and comprising trenches, an isolation area to isolates the gate pad and the active area, and a section of the active area adjacent to the gate pad where a P-body is not formed. According to such the semiconductor device, it is possible to minimize a drain-source leakage current and to stably secure a drain-source breakdown voltage.

19 Claims, 11 Drawing Sheets

(56) References Cited

U.S. PATENT DOCUMENTS

2015/0069536 A1\* 3/2015 Kim ..................... H01L 29/407
 257/412
2017/0092750 A1\* 3/2017 Nagata .................. H01L 21/761
2017/0117396 A1\* 4/2017 Matsuura ............ H01L 29/4916

\* cited by examiner

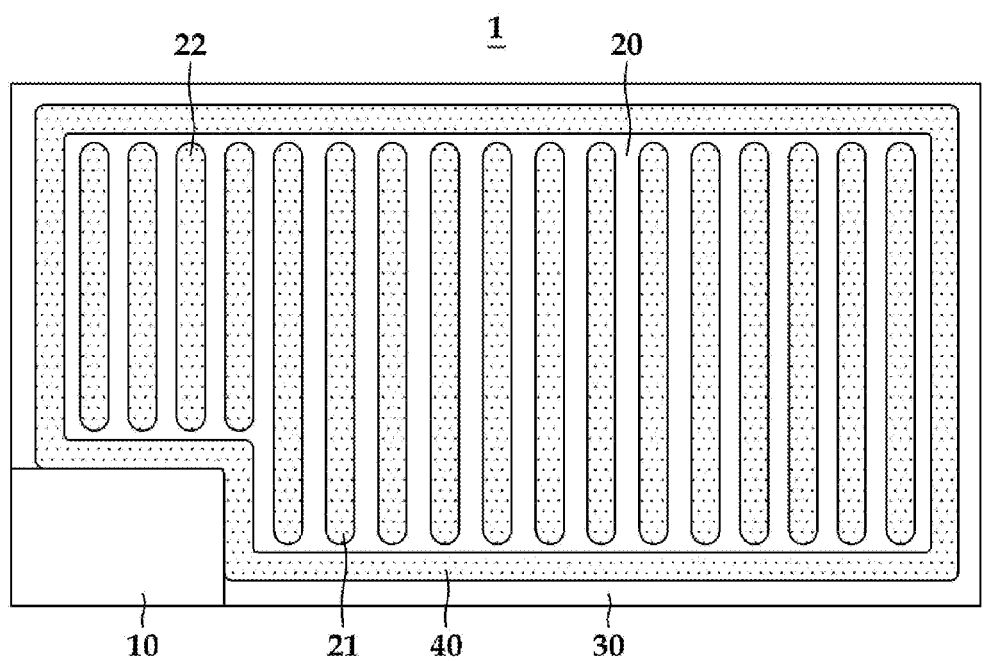
FIG. 1– Conventional Art

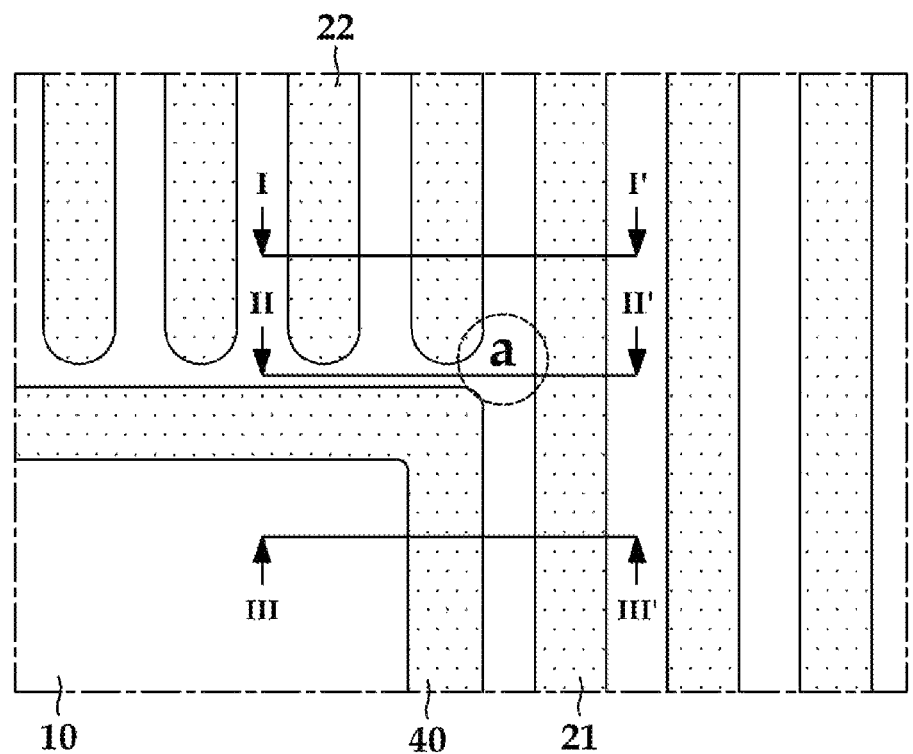
FIG. 2– Conventional Art

FIG. 3A– Conventional Art
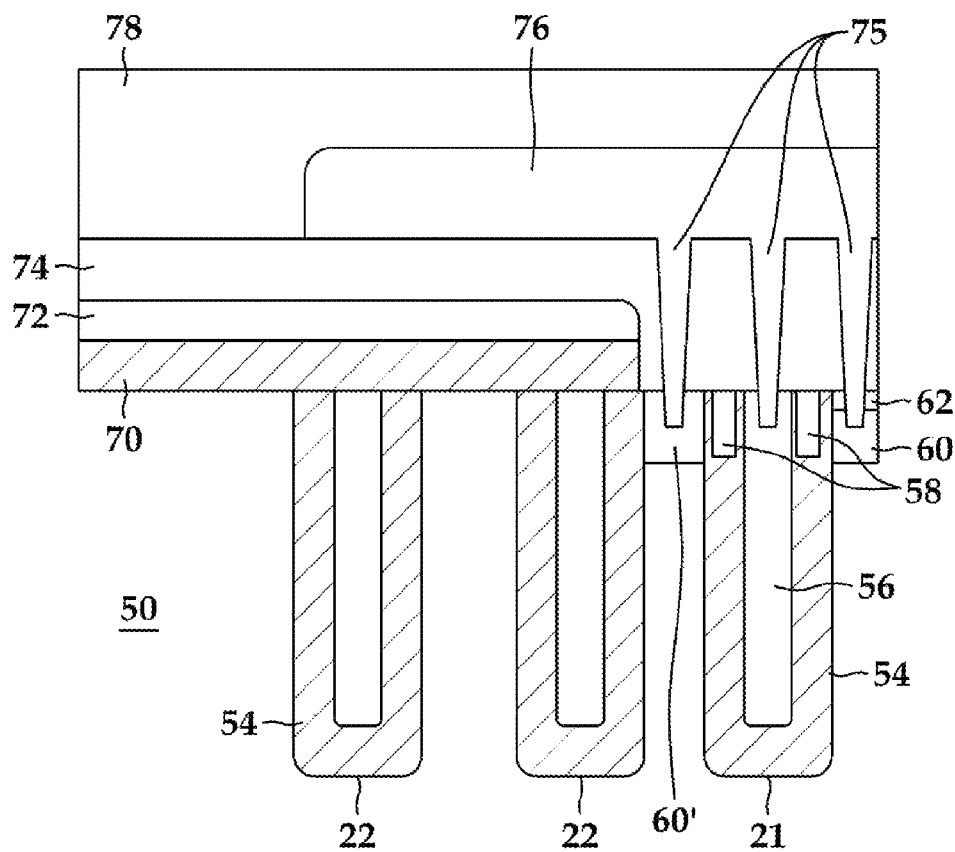

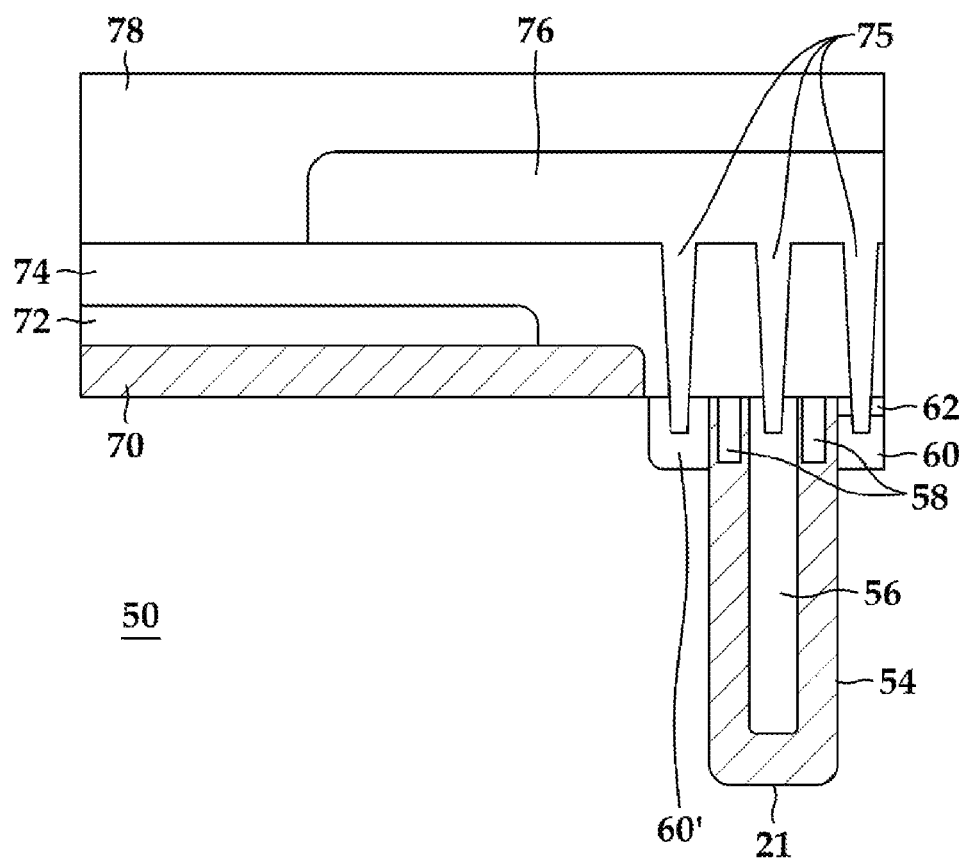
FIG. 3B– Conventional Art

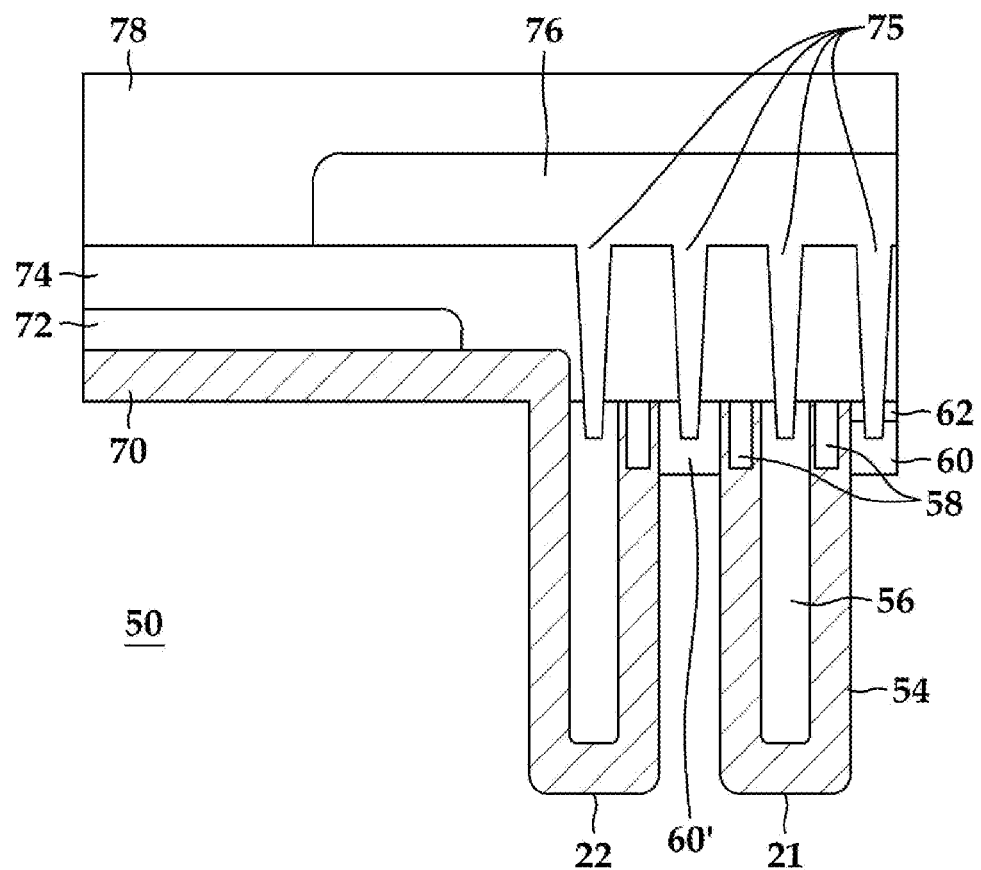
FIG. 3C– Conventional Art

FIG. 4 – Conventional Art
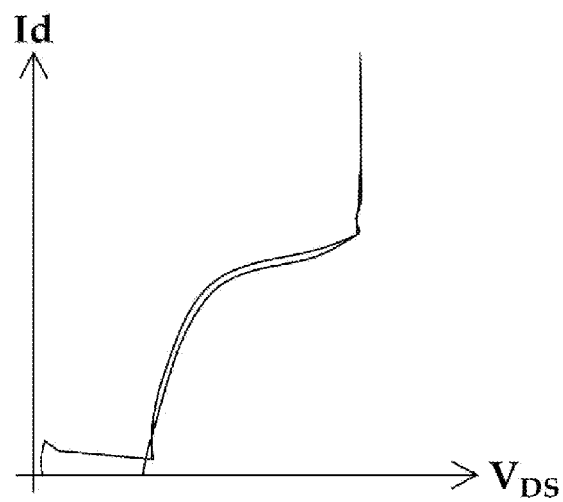
FIG. 5
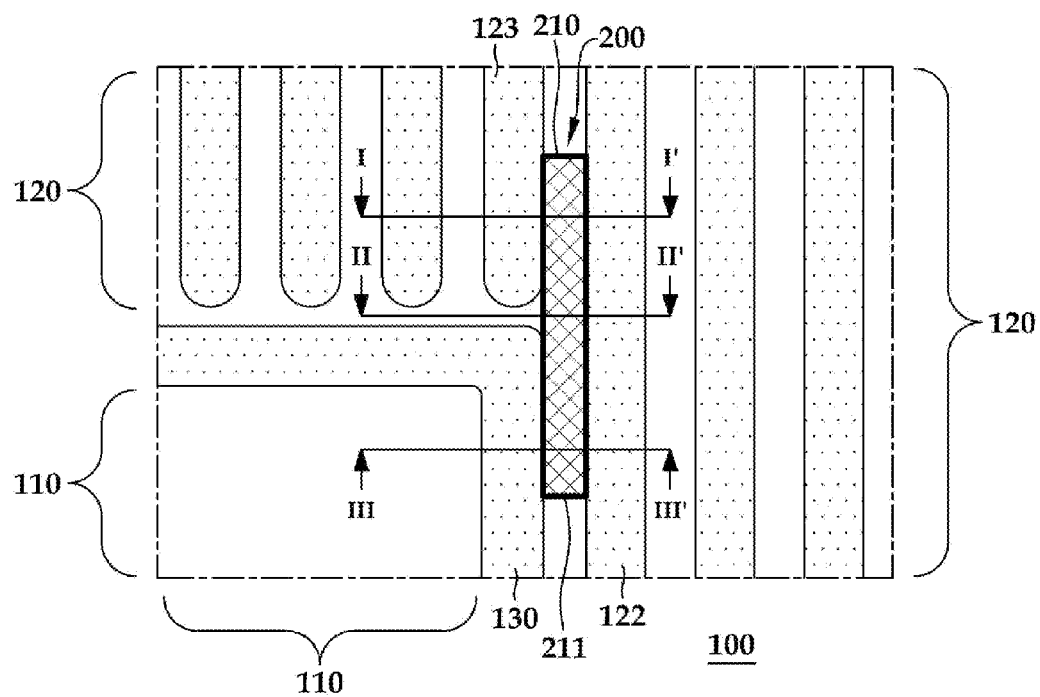

SEMICONDUCTOR DEVICE WITH TRENCH TERMINATION STRUCTURE

CROSS-REFERENCE TO RELATED APPLICATIONS

This application claims the benefit under 35 U.S.C. §119 (a) of Korean Patent Application No. 10-2014-0028627, filed on Mar. 11, 2014, in the Korean Intellectual Property Office, the entire disclosure of which is incorporated herein by reference for all purposes.

BACKGROUND

1. Field

The following description relates to a semiconductor device, and to a semiconductor device configured to suppress an electric field that is formed around an edge of a gate pad of a semiconductor device of Trench Termination structure.

2. Description of Related Art

According to recent large-scale, large-capacity trend regarding all sorts of electric/electronic devices, there is a need for a device having characteristics of a high breakdown voltage, high current, and high speed switching. It is desirous for semiconductor devices to have such characteristic of high breakdown voltage to endure a reverse direction high voltage of P-N junction that is applied to both ends of the semiconductor device, in an off state or at the moment when a switch is turned off. A low on-resistance or low saturation voltage is desired so that a very large scale current may flow and power dissipation may also be small under a conductive state.

Researches and developments have been undertaken regarding semiconductor devices that have the aforesaid technical characteristics. FIGS. 1 to 3 show examples of such semiconductor devices.

FIG. 1 is a plan view of a semiconductor device having an active area and a termination area in accordance with the conventional art. FIG. 2 is a partially enlarged plan view of a part in FIG. 1. FIGS. 3A to 3C are cross-sectional views taken along lines I-I', II-II', and III-III' of the semiconductor device shown in FIG. 2.

As shown in FIG. 1, a semiconductor device 1 includes a gate pad 10, an active area 20 that comprises multiple trenches 21, 22; a termination area 30 that surrounds the active area 20; an isolation area 40 that isolates the active area 20 and the termination area 30. The active area 20 indicates an area in which a semiconductor device operates and a current flows. The isolation area 40 is formed in a trench structure, partitioning an active area 20 and a termination area 30.

A semiconductor device configured as shown in FIG. 1 is desired to have a low drain-source on resistance (RDSon). The RDSon is a drain-source resistance at a specific drain current and gate source voltage. To this end, by forming an oxide layer (i.e., SAC2 Ox, RESURF Ox, Field Ox) to an inside of trenches 21, 22, which are formed in the active area 20, an electric field is supported between trenches.

However, because a space between the trenches cannot be regularly maintained in some areas, an electric field cannot be stably supported. This will be described with reference to cross-sectional views shown in FIGS. 2 and 3A to 3C.

FIGS. 3A to 3C are diagrams illustrating examples of cross-sectional views taken along lines I-I', II-II', and III-III' in the partially enlarged view of FIG. 2.

One or more trenches 21, 22 are formed in an N-type substrate 50, and an oxide layer 54 is formed to the inside of the trenches 21, 22. The trench 21 is a Triple Poly Structure where one center poly electrode 56 and two gate poly electrodes 58 are formed. A P-body area 60, 60' is formed in an upper area of the trench 21 side; an N+ source area 62 is formed through an N+ dopant ion implantation in the P-body area 60 among them.

An oxide layer 70 and an extended gate poly electrode 72 are formed on the N-type substrate 50 and an ILD (Inter Layer Dielectric) 74 is formed on the extended gate poly electrode 72. Multiple via holes 75 are formed in the Inter Layer Dielectric 74. A source metal 76 that is formed on a partial area of the Inter Layer Dielectric 74 is able to contact the center poly electrode 56 and P-body area 60'. A protective layer 78 is formed on the Inter Layer Dielectric 74 and the source metal 76.

In the figures showing a cross-sectional view of FIG. 2, referring to FIGS. 3A and 3C, a space between trenches is regularly maintained, thus, stably supporting an electric field between trenches. An area of II-II' in FIGS. 2 and 3B, there is no trench formed around an edge of a gate pad 10, i.e., a space between the trenches is not regular so that a gate electrode and a source electrode may be isolated. Accordingly, at a point 'a' of FIG. 2, a drain-source leakage current (IDSS) increases.

FIG. 4 is a diagram illustrating an example of a measurement graph of drain-source leakage current (IDSS) in a semiconductor device having a structure of FIG. 2. Referring to FIG. 4, it may be understood that a drain current ($I_D$) drastically increases at a specific point when a drain-source voltage increases. When this happens, a semiconductor device cannot secure against a high drain-source breakdown voltage (BVDSS), thus subsequently causing efficiency of the semiconductor device to be degraded.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An object of the present disclosure is to provide a semiconductor device configured to improve a structure of an edge adjacent area of a gate pad to prevent the generation of drain-source leakage current, in regards to a semiconductor device where a trench termination structure is applied.

Another object of the present disclosure is to provide a semiconductor device that suppresses the generation of electric field in the edge adjacent area by not forming a body area that is formed with dopants different from a substrate in an edge adjacent area of a gate pad.

In one general aspect, there is provided a semiconductor device including a gate pad formed on a substrate, an active area formed in the substrate and comprising trenches, an isolation area to isolate the gate pad and the active area, and a section of the active area adjacent to the gate pad where a P-body is not formed.

A junction may be absent in the section where the P-body is not formed.

A junction may be formed at a boundary surface of the section where the P-body is not formed.

The section where the P-body is absent may be formed such that electric fields extending at boundary surfaces do not overlap with each other.

An edge area of the gate pad may be located at a center of the section where the P-body is not formed.

A portion of the section where the P-body is not formed may be located between one of the trenchs and the isolation area.

The isolation area may be formed in the form of trench.

The isolation area may be filled with polysilicon.

The trench may be formed in a Triple Poly Structure.

In another general aspect, there is provided a semiconductor device including a substrate, a trench formed in the substrate, and a P-body area formed only at one side of the trench.

The semiconductor device may include an oxide layer formed on the substrate, a gate poly electrode area formed on the oxide layer, an Inter Layer Dielectric (ILD) covering the oxide layer and the gate poly electrode area and comprising at least one via hole, and a source metal area formed on the Inter Layer Dielectric and in contact with the trench through the via hole.

The trench may be a Triple Poly Structure.

The Triple Poly Structure may include one center poly electrode and two gate poly electrodes.

The source metal area may be connected to the center poly electrode and the body area through the via hole.

A side of the trench may not be formed of the body area, and the side is in a direction of a gate pad formed on the substrate.

In another general aspect, there is provided a semiconductor device including an N-type substrate, at least one trench formed in the substrate, and comprising a center poly electrode and two gate poly electrodes, a first insulating layer formed between a surface of the trench and the gate poly electrodes, a second insulating layer formed between the gate poly electrodes and the center poly electrode, an oxide layer formed on the inside of the least one trench, an Inter Layer Dielectric (ILD) covering the oxide layer and the gate poly electrode area and comprising a via hole, a source metal area formed on the ILD and in contact with the trench through the via hole, and a P-body area formed only at one side of the at least one trench.

An N+ source area is not formed in a portion of the P-body area.

A P-body area may not be formed between two trenches.

The present disclosure is configured to improve a structure so that only an N-type substrate is to exist in an area adjacent to an edge of a gate pad in regards to a semiconductor device such as SR MOSFET (Synchronous Rectification MOSFET) (i.e., a P-body area is not formed) thereby fundamentally preventing the formation of electric field in that area. Hence, a drain-source leakage current (IDSS) is minimized or is not generated, such that a drain-source breakdown voltage (BVDSS) of a semiconductor device may be stably secured.

Due to the minimization of drain-source leakage current (IDSS), a substrate resistance is lowered such that a turn-on resistance (Rdson) may be more reduced. Accordingly, a high speed switching is possible.

Other features and aspects may be apparent from the following detailed description, the drawings, and the claims.

BRIEF DESCRIPTION OF THE DRAWINGS

FIG. 1 is a diagram illustrating an example of a semiconductor device having an active area and a termination area according to the conventional art.

FIG. 2 is a diagram illustrating an example of partially enlarged plan view of FIG. 1.

FIGS. 3A to 3C are diagrams illustrating examples of cross-sectional views taken along lines I-I', II-II', and III-III' of FIG. 2.

FIG. 4 is a diagram illustrating an example of a measurement graph of an IDSS of the semiconductor device in FIG. 1.

FIG. 5 is a diagram illustrating an example of a plan view of a semiconductor device.

Figure 6A:
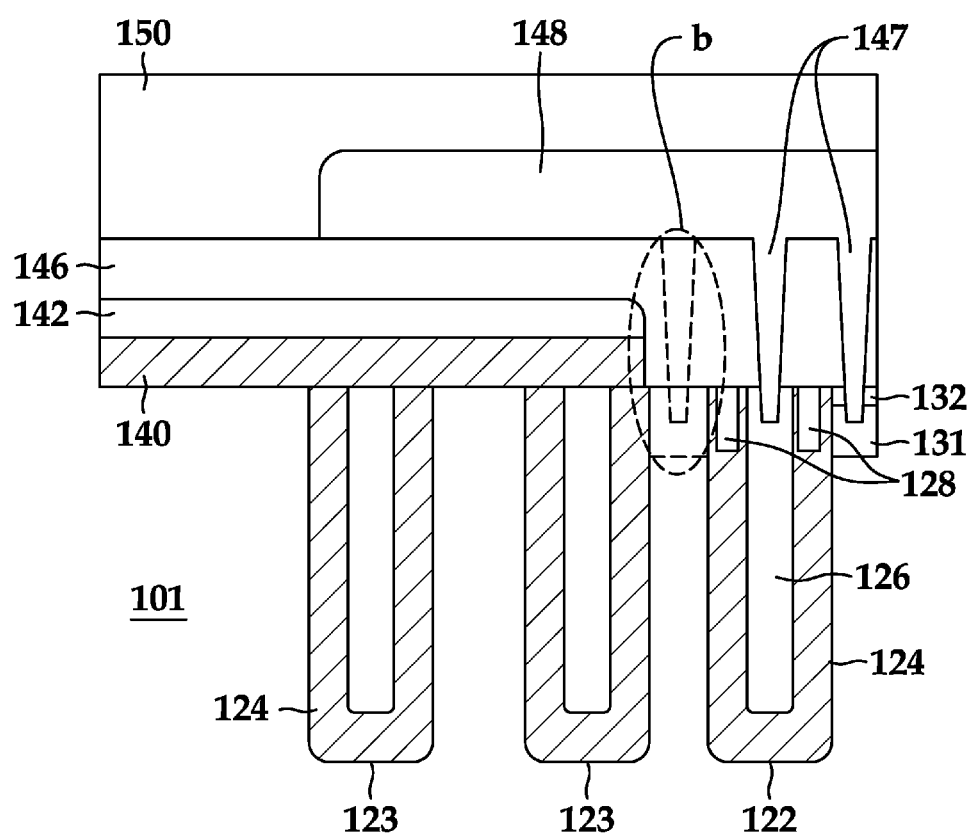
FIGS. 6A to 6C are diagrams illustrating example of cross-sectional views taken along lines I-I', II-II', and III-III' of FIG. 5.

Throughout the drawings and the detailed description, unless otherwise described, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

In a semiconductor device where an active area, a termination area, a trench termination are included, a P-body area is not formed in an edge area adjacent to a gate pad and a structure is improved to remove a via hole for contact with the source metal formed on the N-type substrate. Thereby suppressing the generation of electric field and minimizing a drain-source leakage current.

A semiconductor device in accordance with the present disclosure that provides the aforesaid characteristics will be explained in detail with reference to the accompanying drawings.

Figure 6B:
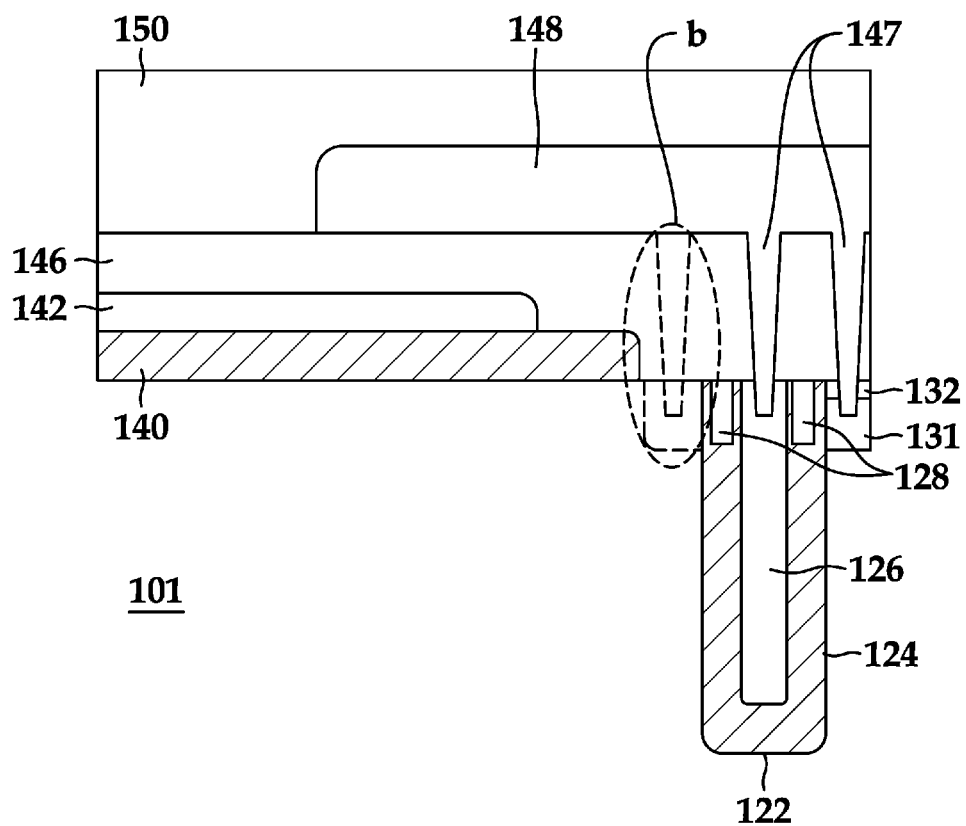
Figure 6C:
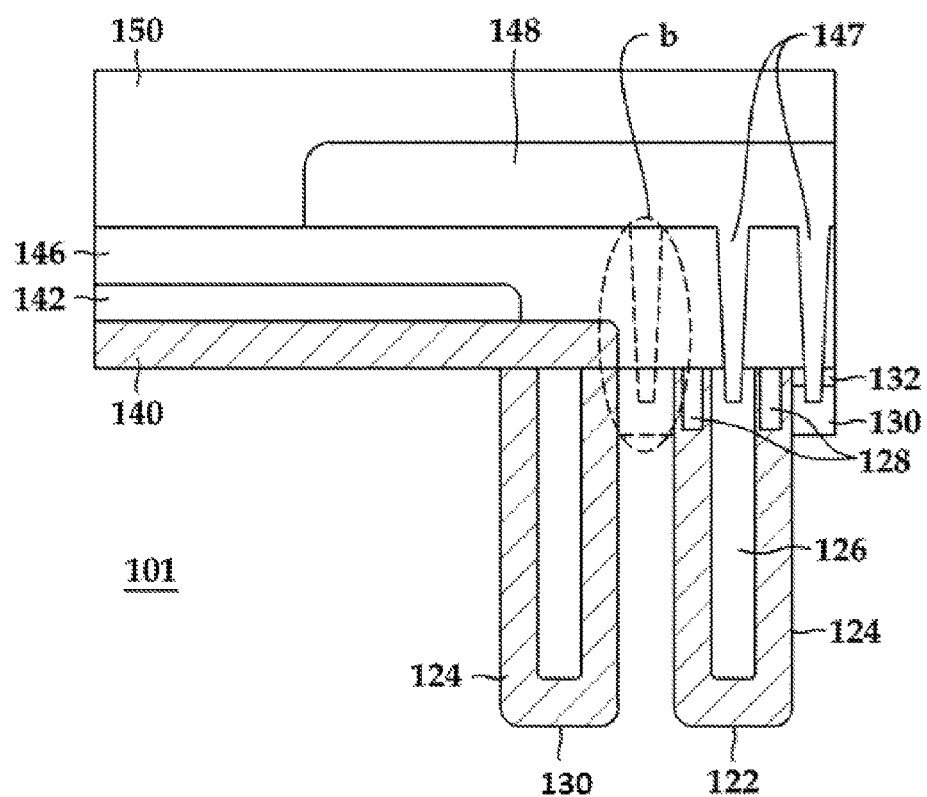

FIG. 5 is a diagram illustrating an example of a partially enlarged plan view of a semiconductor device. FIGS. 6A to 6C are diagrams illustrating example of cross-sectional views taken along lines I-I', II-II', and III-III' shown in FIG. 5.

As shown in FIG. 5, a semiconductor device 100 includes a gate pad 110 that receives a bias, an active area 120 that comprises multiple trenches 122, 123 in which an actual current flows, an isolation area 130 that is formed in a trench structure so as to isolate a gate pad 110 and an active area 120.

The semiconductor device 100 of FIG. 5 is identical to that of FIG. 2, however, there is a difference in an area adjacent to an edge of the gate pad 110 (hereinafter, referred to as an "adjacent area").

An N-type substrate exists in the adjacent area in FIG. 5, and a section 200 where a P-body area is not formed in the N-type substrate (hereinafter, referred to as a "non-formation section") exists. The non-formation section 200 is formed in a regular length. Upper and lower boundary surfaces 210, 211 of the non-formation section are in a state of P/N junction, i.e., the non-formation section 200 is N-type and the rest portions are P-type. Meanwhile, a center of the non-formation section 200 may be located around the edge area of gate pad 110 and has a length sufficient so that the upper and lower boundary surfaces 210, 211 may not overlap with each other when the electric field is diffused therefrom (see FIG. 7B). This minimizes the generation of drain-source leakage current in the adjacent area and also supports electric field by means of trenches adjacent to the non-formation section 200 (see FIG. 7A).

FIGS. 6A to 6C are diagrams illustrating example of a cross-sectional view of a semiconductor device that includes the non-formation section shown in FIG. 5. FIGS. 6A to 6C show cross-sectional views taken along I-I', II-II', and III-III' of FIG. 5 respectively.

Referring to FIGS. 5 to 6C, a trench 122 is formed in an N-type substrate 101. The number of trench 122, 123 is shown differently from each other in accordance with the cross sectional position of the semiconductor device.

Among the trenches shown in FIGS. 6A to 6C, trench 122 is formed in a Triple Poly Structure. Triple Poly Structure comprises a center poly electrode formed in the center of trench 122, two gate poly electrodes 128 formed at the side of center poly electrode 126. A gate insulating layer (not shown) is formed between the inner surface of the trench 122 and the gate poly electrode 128 and between the gate poly electrode 128 and the center poly electrode 126.

An oxide layer 124 is formed to the inside of the trenches 122 and 123. The oxide layer 124 uses an SAC2 Ox (Sacrificial Oxide), a RESURF Ox (Reduced surface field) or a Field Ox. The oxide layer 124 supports the electric field between the trenches 122 and 123, and thus, to realize a higher drain-source breakdown voltage (BVDSS).

A P-body area 131 is formed at one side of the trench 122. An N+ source area 132 is formed in the P-body area 131, through an N+ dopant ion implantation. P-body area 131 is not formed between each trench, i.e., the conventional P-body area and via hole are not formed in the non-formation section 200, as in "b" area.

An oxide layer 140 is formed on the N-type substrate 101. The oxide layer consists of SAC2 Ox, RESURF Ox or Field Ox.

A gate poly electrode area 142 is formed at an upper surface of the oxide layer 140. The gate poly electrode area 142 is formed upto the trench 123 adjacent to the non-formation section 200.

An Inter Layer Dielectric (ILD) 146 is formed on the gate poly electrode area 142. A via hole 147 is formed in the ILD 146, and the via hole 147 serves to connect the center poly electrode 126 of the trench 122 and the source metal 148 (described later). Compared to the conventional art, the via hole 147 is formed partially in the Inter Layer Dielectric 146. Thus, no P-body area and via hole are formed at all in the non-formation section 200 which is located in the adjacent area. This is accomplished through a process of controlling a PR (photo resist) mask length among the manufacturing processes of the semiconductor device.

A protective layer 150 is formed on the Inter Layer Dielectric 146 and the source metal 148. The protective layer 150 protects an outer surface of a chip and may be made using nitride.

Figure 7A:
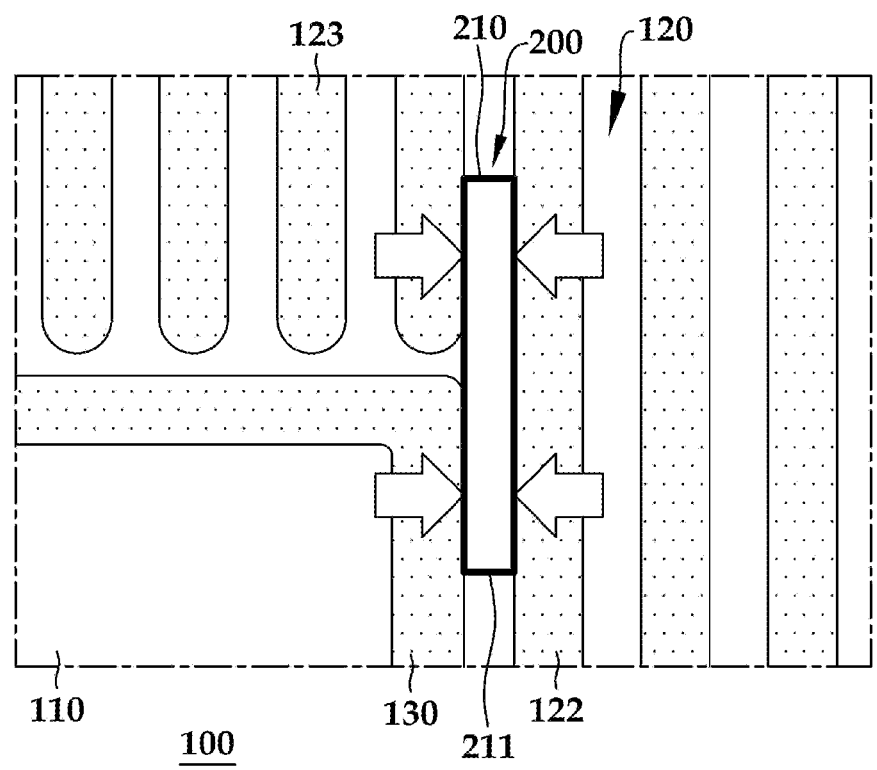
FIG. 7A is a diagram illustrating an example of a state of an electric field support.
Figure 7B:
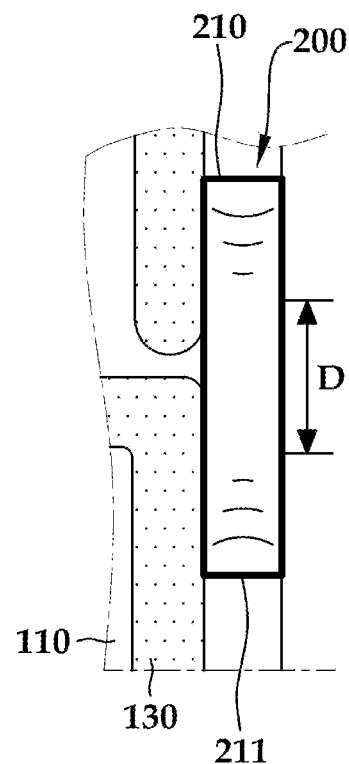
FIG. 7B is a diagram illustrating an example of an electric field extension in a section where a P-body is not formed.

Meanwhile, FIG. 7A is a diagram illustrating an example of an electric field support. FIG. 7B is a diagram illustrating an example of an electric field extension in the section where a P-body is not formed.

The electric field is indicated by the direction arrows in FIG. 7A. The non-formation section 200 is configured to support an electric field trenches adjacent to the non-formation section 200. The non-formation section 200 is formed such that an electric field which is extended from the upper/lower boundary surfaces 210, 211 has a sufficient length and are not overlapped with each other. In an non-exhaustive example, the length of the electric field may be "D," but this length may be varied.

When a P-body area is not formed in an edge adjacent area to a gate pad 110, as described above, an extension of the electric field can be prevented thus enabling a drain-source leakage current (IDSS) aforementioned in the conventional art to be minimized.

Figure 8:
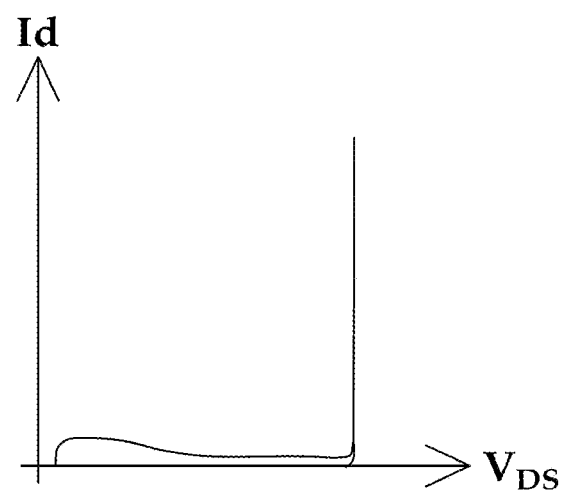
FIG. 8 is a diagram illustrating an example of measurement graph of an IDSS of the semiconductor device in FIG. 5.

This will be easily understood by comparing FIG. 8, which is a diagram illustrating an example of a result graph in which an IDSS of a semiconductor device is measured, with FIG. 4 illustrating an example of a result graph in the conventional art.

In FIG. 4, a drain current ($I_D$) drastically increases at a specific point when a drain-source voltage increases. However, referring to FIG. 8, a drain-source leakage current is not generated at all. This indicates that generation of an electric field in accordance with a PN junction, does not appear in the non-formation section of the semiconductor devices described herein.

As described above, the semiconductor device in which a trench termination structure is applied is configured such that a P-body area is not formed in an edge adjacent area of a gate pad to minimize a drain-source leakage current and to stably secure a drain-source breakdown voltage.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:
1. A semiconductor device comprising:
  a gate pad area in which a gate pad is formed on a substrate, wherein the gate pad is configured to receive a bias voltage;
  an active area in which active trenches are formed in the substrate;

an isolation area comprising an isolation trench in the substrate between the gate pad area and the active area; and a section of the active area adjacent to the gate pad where a P-body is not formed.

2. The semiconductor device of claim 1, wherein a junction is absent in the section where the P-body is not formed.

3. The semiconductor device of claim 1, wherein a junction is formed at a boundary surface of the section where the P-body is not formed.

4. The semiconductor device of claim 3, wherein the section, where the P-body is not formed, is formed such that electric fields extending at boundary surfaces do not overlap with each other.

5. The semiconductor device of claim 1, wherein an edge area of the gate pad is located at a center of the section where the P-body is not formed.

6. The semiconductor device of claim 1, wherein a portion of the section where the P-body is not formed is located between one of the active trenches and the isolation area.

7. The semiconductor device of claim 1, wherein the isolation trench is filled with polysilicon.

8. The semiconductor device of claim 1, wherein an active trench of the active trenches is formed in a Triple Poly Structure.

9. A semiconductor device comprising:
a substrate;
a gate pad formed on the substrate;
a trench formed in the substrate;
a first gate poly electrode formed in the trench on a first side of the trench and a second gate poly electrode formed in the trench on a second side of the trench opposite to the first side of the trench with a gate insulating layer between the first and second gate poly electrodes in the trench; and
a P-body area formed only at one side of the trench.

10. The semiconductor device of claim 9, further comprising:
an oxide layer formed on the substrate;
a gate poly electrode area formed on the oxide layer;
an Inter Layer Dielectric (ILD) covering the oxide layer and the gate poly electrode area and comprising at least one via hole; and
a source metal area formed on the Inter Layer Dielectric and in contact with the trench through the via hole.

11. The semiconductor device of claim 10, wherein the trench is a Triple Poly Structure.

12. The semiconductor device of claim 11, wherein the Triple Poly Structure comprises one center poly electrode and the gate poly electrodes.

13. The semiconductor device of claim 12, wherein the source metal area is connected to the center poly electrode and the P-body area through the via hole.

14. The semiconductor device of claim 10, wherein a P-body area is not formed at a side of the trench, and the side is in a direction of a gate pad formed on the substrate.

15. A semiconductor device comprising:
an N-type substrate;
a gate pad formed on the substrate;
at least one trench formed in the substrate, and comprising a center poly electrode and two gate poly electrodes;
an oxide layer that is formed inside the at least one trench, disposed around the center poly electrode, and disposed around the two gate poly electrodes, the oxide layer comprising:
a first insulating layer formed between a surface of the trench and the gate poly electrodes; and
a second insulating layer formed between the gate poly electrodes and the center poly electrode;
an Inter Layer Dielectric (ILD) covering the oxide layer and the gate poly electrode area and comprising a via hole;
a source metal area formed on the ILD and in contact with the trench through the via hole; and
a P-body area formed on the side of one of the gate poly electrodes and only at one side of the at least one trench.

16. The semiconductor device of claim 15, wherein an N+ source area is formed in a portion of the P-body area.

17. The semiconductor device of claim 15, further comprising a P-body area not being formed between two trenches.

18. The semiconductor device of claim 17, further comprising a gate pad separated from the P-body area.

19. The semiconductor device of claim 18, wherein a region of the P-body area is not formed on a peripheral corner region of the gate pad.

* * * * *